US008003023B2

United States Patent
Jo et al.

(10) Patent No.: US 8,003,023 B2
(45) Date of Patent: Aug. 23, 2011

(54) MASTER MOLD, MASTER MOLD FABRICATION METHOD, AND METHOD FOR FABRICATING LIQUID CRYSTAL DISPLAY DEVICE USING THE SAME

(75) Inventors: Gyoo-Chul Jo, Gyeonggi-Do (KR); Jin-Wuk Kim, Gyeonggi-Do (KR); Chang-Hee Lee, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 546 days.

(21) Appl. No.: 11/477,909

(22) Filed: Jun. 30, 2006

(65) Prior Publication Data

US 2007/0153222 A1    Jul. 5, 2007

(30) Foreign Application Priority Data

Dec. 30, 2005    (KR) .................. 10-2005-0136173

(51) Int. Cl.
    *B32B 15/04*    (2006.01)
    *G03C 11/22*    (2006.01)
    *G02F 1/13*    (2006.01)

(52) U.S. Cl. ......... 264/2.5; 264/227; 264/313; 264/338; 264/483; 264/494; 249/114.1; 249/135

(58) Field of Classification Search .......... 264/219–221, 264/227, 241, 259, 297.4, 313, 331.14, 335, 264/2.5, 225, 250, 238, 293, 129, 325, 319, 264/330, 337, 338, 494–496, 483; 425/127, 425/375, 385, 403, 470; 249/114.1–116, 249/134–135; 427/133, 135; 106/38.2, 38.22, 106/38.27, 38.3, 38.8, 38.9

See application file for complete search history.

(56) References Cited

U.S. PATENT DOCUMENTS 4,724,043 A * 2/1988 Bergendahl et al. .............. 216/2
(Continued)

FOREIGN PATENT DOCUMENTS

CN        1317057        10/2001
(Continued)

OTHER PUBLICATIONS

Wang et al., Characterization of Surface properties of Plasma polymerized Fluorinated Hydrocarbon layers . . . , 1993, Journal of Applied polymer Science, vol. 49, pp. 701-710.*

(Continued)

*Primary Examiner* — Joseph S Del Sole
*Assistant Examiner* — Dimple Bodawala
(74) *Attorney, Agent, or Firm* — McKenna Long & Aldridge LLP (57) ABSTRACT

A method for fabricating a liquid crystal display (LCD) device wherein a photolithography technique is replaced by soft lithography is disclosed. The method includes: forming a thin film transistor array substrate; forming a color filter substrate; bonding the thin film transistor array substrate and the color filter substrate; and applying a liquid crystal between the thin film transistor array substrate and the color filter substrate, wherein at least one of the forming the thin film transistor array substrate and the forming the color filter substrate includes a pattern forming method using a soft mold. The pattern forming method may be a soft lithography process that includes: contacting a soft mold having a particular pattern with a surface of a buffer layer and applying a constant heat to the soft mold and buffer layer to transfer the particular pattern onto the buffer layer.

6 Claims, 9 Drawing Sheets

U.S. PATENT DOCUMENTS

| | | | | |
|---|---|---|---|---|
| 4,863,809 | A | * | 9/1989 | Brar et al. ............... 428/623 |
| 5,599,489 | A | * | 2/1997 | Saiki et al. ............... 264/83 |
| 6,266,193 | B1 | * | 7/2001 | Saif et al. ............... 359/582 |
| 6,677,703 | B2 | * | 1/2004 | Ito et al. ............... 313/478 |
| 6,783,704 | B1 | * | 8/2004 | Anthes et al. ............... 252/512 |
| 2002/0084553 | A1 | * | 7/2002 | Nun et al. ............... 264/284 |
| 2002/0127499 | A1 | | 9/2002 | Endo et al. |
| 2003/0010241 | A1 | * | 1/2003 | Fujihira et al. ............... 101/483 |
| 2003/0040245 | A1 | | 2/2003 | Song et al. |
| 2003/0152864 | A1 | * | 8/2003 | Araki et al. ............... 430/270.1 |
| 2003/0157244 | A1 | * | 8/2003 | Kawase ............... 427/58 |
| 2004/0175584 | A1 | * | 9/2004 | Yializis ............... 428/463 |
| 2004/0183236 | A1 | * | 9/2004 | Ogino et al. ............... 264/496 |
| 2004/0232105 | A1 | * | 11/2004 | Kaise et al. ............... 216/26 |
| 2005/0146079 | A1 | * | 7/2005 | Chou ............... 264/319 |
| 2008/0286974 | A1 | * | 11/2008 | Kim et al. ............... 438/702 |

FOREIGN PATENT DOCUMENTS

| | | | |
|---|---|---|---|
| DE | 19543133 A1 | * | 5/1997 |
| EP | 933388 A2 | * | 8/1999 |
| WO | WO 9300394 A1 | * | 1/1993 |
| WO | WO 2004/090636 A1 | * | 10/2004 |

OTHER PUBLICATIONS

Stevenson, Plasma Processing and Hydrophobic surfaces, Oct. 2006, pp. 1-4.*

Schvartzman et al., Plasma Fluorination of DLC surfaces: mechanism and application to nanoimprint lithography, Mar. 17, 2009, pp. 1-7.*

* cited by examiner

MASTER MOLD, MASTER MOLD FABRICATION METHOD, AND METHOD FOR FABRICATING LIQUID CRYSTAL DISPLAY DEVICE USING THE SAME

This application claims the benefit of Korean Patent Application No. 10-2005-0136173, filed on Dec. 30, 2005, which is hereby incorporated by reference for all purposes as if fully set forth herein.

BACKGROUND OF THE INVENTION

1. Field of the Invention

The present invention relates to a master mold used in soft-lithography, a master mold fabrication method, and a method for fabricating a liquid crystal display device using the same. More particularly, the present invention relates to a master mold, a master mold fabrication method, and a method for fabricating a liquid crystal display device using the same, whereby a rate of defects occurring during fabrication processes may be decreased.

2. Discussion of the Related Art

Liquid crystal display (LCD) devices are a type of flat panel display device and are increasingly used in visual information transmission media. Accordingly, various types of LCD devices are being developed. LCD devices are desirable because they consume a low amount of power, have a compact construction, are light in weight, and have a superior image quality.

LCD devices are also produced in great quantities to be used in various applications such as TV sets, vehicle navigation systems and computer monitors. LCD devices are also considered to be substitutes for cathode ray tubes (CRTs).

In general, an LCD device supplies a data signal based upon image information to liquid crystal cells arranged in a matrix. Thereby, desired images are displayed by adjusting a light transmissivity of the liquid crystal cells.

Figure 1:
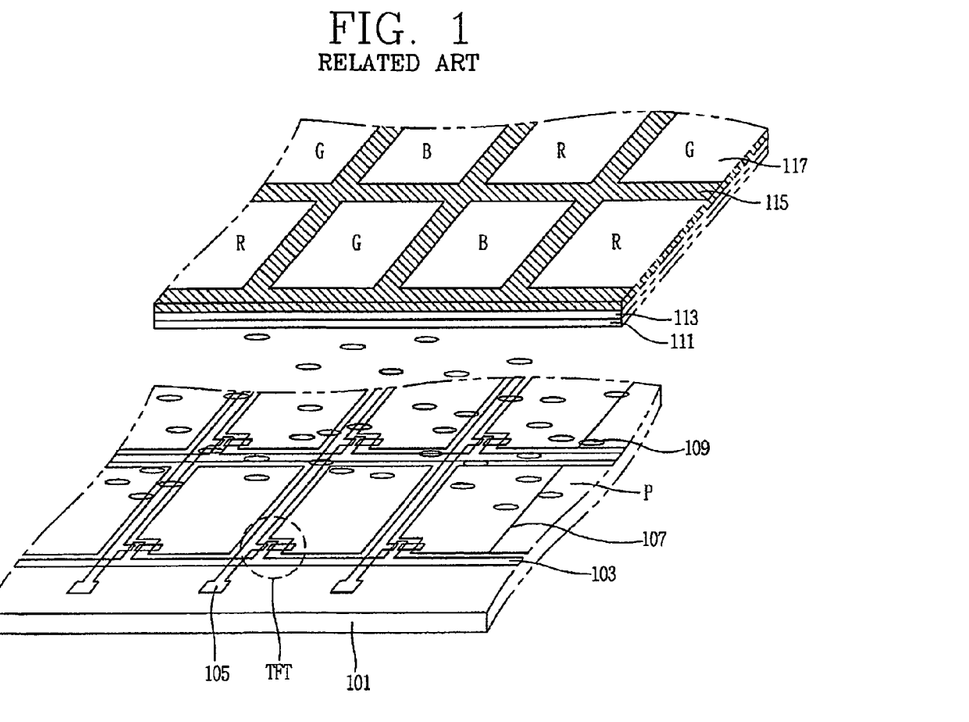
FIG. 1 is an exploded view showing a related art LCD device.

FIG. 1 shows an exploded view of a related art LCD device, a schematic construction of the LCD device will now be explained.

As shown in FIG. 1, a related art LCD device includes a color filter substrate 113 as an upper substrate, a thin film transistor (TFT) array substrate 101 as a lower substrate, and a liquid crystal layer 109.

The color filter substrate 113 includes color filters 117, a black matrix (BM) 115 disposed between each color filter 117, and a common electrode 111 formed at a lower side of the color filter substrate 113.

The TFT array substrate 101 includes pixel electrodes 107 formed in each pixel region P, TFTs used as switching devices, gate lines 103 and data lines 105. The TFTs are formed in a matrix at each crossing of a gate line 103 and a data line 105. The pixel regions P are formed at each region between the gate line 103 and the data line 105. The pixel electrode 107 may be a transparent conductive layer.

The liquid crystal layer 109 is formed between the color filter substrate 113 and the TFT array substrate 101, and includes a liquid crystal material having optical anisotropy with respect to an optical refractive index.

LCD devices may also include polarizers (not shown) contacting surfaces of both the upper and lower substrates of an LCD panel. A lower portion of a polarizer on the lower substrate may include a back light unit (not shown) having a lamp and optical sheets. LCD devices may also include top and bottom cases (not shown) that support the LCD panels.

Figure 2:
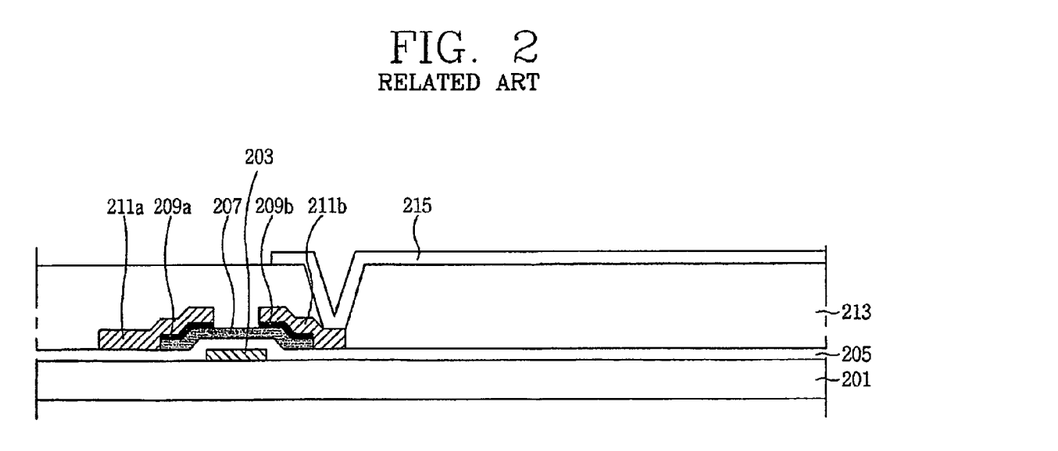
FIG. 2 is a sectional view showing a related art thin film transistor array substrate of a related art LCD device.

FIG. 2 shows a sectional structure of a related art TFT array substrate in a related art LCD device.

The TFT array substrate of the related art LCD device, as shown in FIG. 2, is constructed such that a gate electrode 203 is formed on the substrate 201. A gate insulating layer 205, an activation layer pattern 207 and ohmic contact layers 209a and 209b are sequentially deposited on the gate electrode 203, such that the insulating layer 205 is interposed between the gate electrode 203 and the activation layer pattern 207.

Source and drain electrodes 211a and 211b may be formed on the ohmic contact layers 209a and 209b to partially or wholly overlap the ohmic contact layers 209a and 209b.

An intermediate layer 213 is formed on the source and drain electrodes 211a and 211b to partially expose the drain electrode 211b. A transparent pixel electrode 215 is formed on the intermediate layer 213 and connects to the exposed drain electrode 211b.

A process for fabricating the related art LCD device having such a construction requires forming various patterns. Photolithographic techniques are generally used in the processes.

A method for fabricating a related art TFT array substrate using a related art photolithographic technique will now be explained with reference to FIGS. 3A through 3G.

Figure 3A:
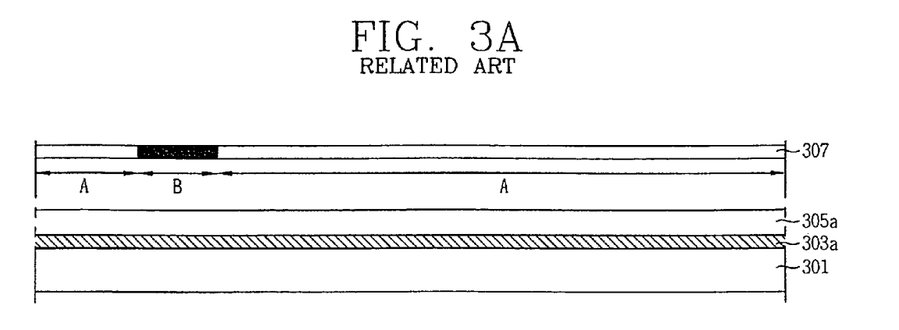
FIGS. 3A, 3B, 3C, 3D, 3E, 3F and 3G are sectional views showing a method for fabricating a related art thin film transistor array substrate of a related art LCD device.
Figure 3B:
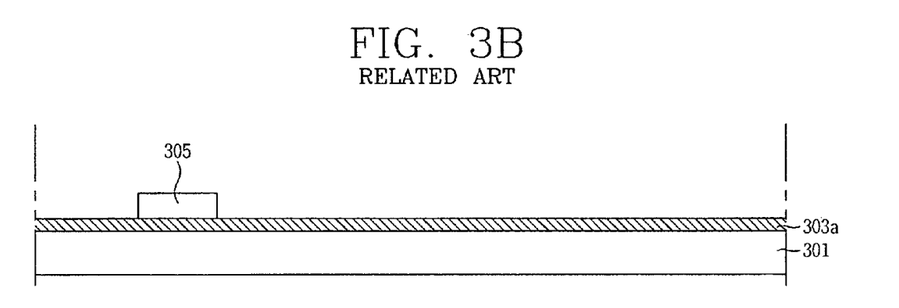
Figure 3C:
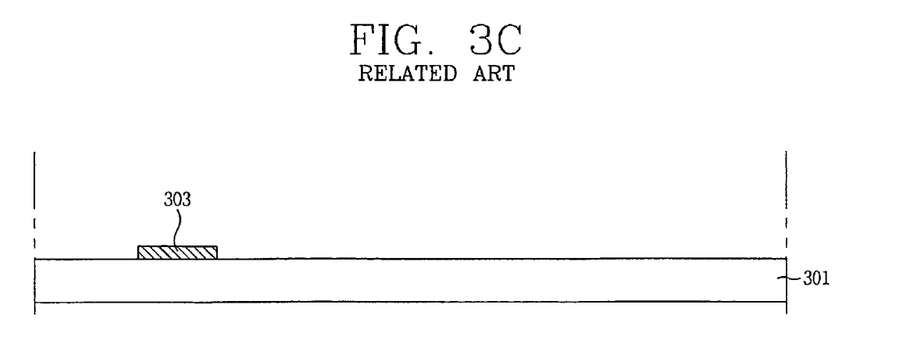

As shown in FIGS. 3A, 3B and 3C, a first metal layer 303a (e.g., an aluminum (Al)) is formed on an insulating substrate 301 (e.g., glass), and a photolithography technique is used to form the gate electrode 303.

The photolithography technique may be performed such that a photo-resist is coated on the first metal layer 303a to form a photo-resist layer 305a. Then, an exposing process is performed using a first photo mask 307. The first photo mask 307, as shown in FIG. 3A, includes a transmitting region A and a shielding region B. Light transmitted through the transmitting region A exposes and chemically changes the photo-resist layer 305a. The chemical change in the photo-resist layer 305a is different depending on the type of photo-resist material. The exposed portion of a positive photo-resist material is removed by a development solution, whereas the non-exposed portion of a negative photo-resist material is removed by the development solution. As shown, a positive photo-resist is used.

When the exposed portion of the photo-resist 305a is removed by the development solution, the photo-resist pattern 305 is formed on the first metal layer 303a as shown in FIG. 3B. The first metal layer 303a is etched using the photo-resist pattern 305 as a mask. Upon removing residual photo-resist pattern 305, a gate electrode 303 having the shape of the photo-resist pattern 305 is formed as shown in FIG. 3C.

Figure 3D:
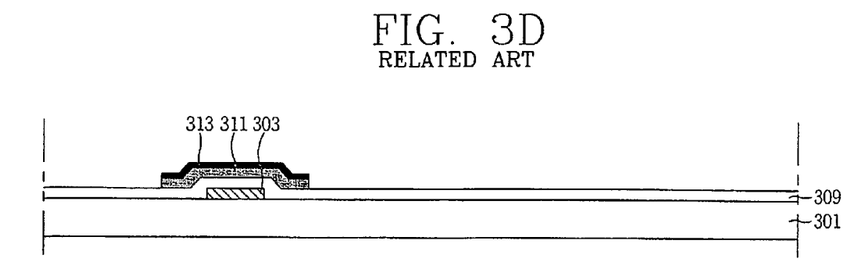

As shown in FIG. 3D, a gate insulating layer 309 may be formed on the substrate 301 including the gate electrode 303, and then an activating layer pattern 311 and an ohmic contact layer 313 are sequentially formed on the gate insulating layer 309. The gate insulating layer 309 may be formed of silicon dioxide ($SiO_2$) or silicon nitride (SiNx). The activating layer pattern 311 may be formed of pure amorphous silicon and the ohmic contact layer 313 may be formed of amorphous silicon in which impurities have been doped. Then, the activating layer pattern 311 and the ohmic contact layer 313 are patterned by the photolithography technique used in forming the gate electrode 303. Here, a second photo mask (not shown) is used in the photolithography technique. Ohmic contact patterns 313a and 313b are thus formed.

Figure 3E:
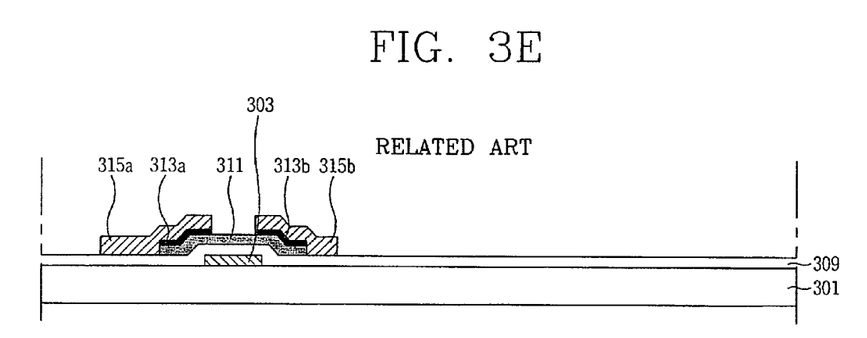

As shown in FIG. 3E, source and drain electrodes 315a and 315b are formed. In this process, a second metal layer such as an aluminum (Al) or molybdenum (Mo) is formed on the substrate 301 including the activating layer pattern 311 and the ohmic contact patterns 313a and 313b. Then, the photo-lithography technique is performed on the second metal layer using a third photo mask (not shown). As a result, a source electrode 315a and a drain electrode 315b are formed on the ohmic contact patterns 313a and 313b to be spaced apart from each other by an interval.

Figure 3F:
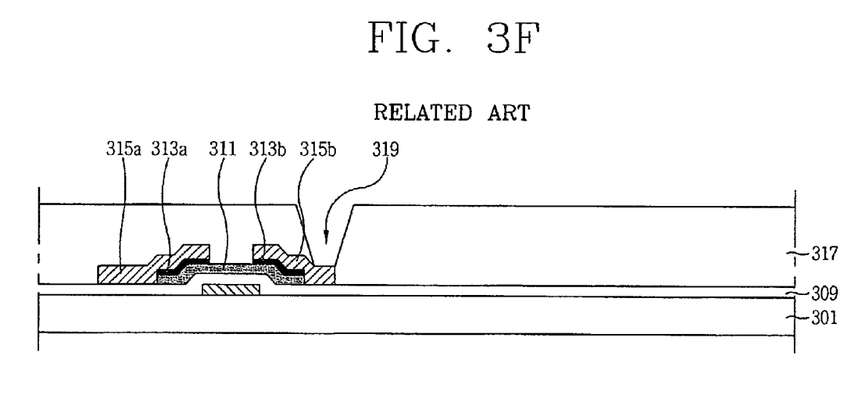

As shown in FIG. 3F, an intermediate layer 317 is formed on the substrate 301 including the source and drain electrodes 315a and 315b. A contact hole 319 is formed on the intermediate layer 317 and partially exposes the lower drain electrode 315b. The photolithography technique and a fourth photo mask (not shown) are used to form the contact hole 319.

Figure 3G:
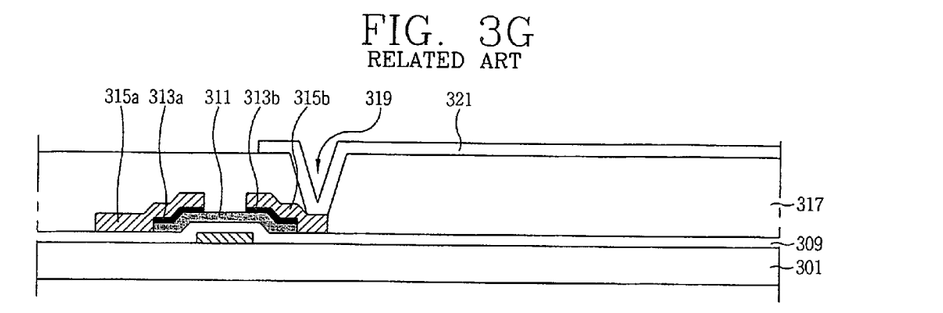

As shown in FIG. 3G, a pixel electrode 321 is formed on the intermediate layer 317. The pixel electrode 321 may be made of a transparent conductive layer, such as indium tin oxide or indium zinc oxide. The photolithography technique is used to pattern the transparent conductive layer to thereby form the pixel electrode 321. The pixel electrode 321 may be connected to the drain electrode 315b via the contact hole 319 formed on the intermediate layer 317.

Thus, the related art TFT array substrate included in a related art LCD device is fabricated using the aforementioned processes. In the processes, the photolithography technique is used five times, namely, in the forming of the gate electrode 303, then in the forming of the ohmic contact patterns 313a and 313b, then in the forming of the source/drain electrodes 315a and 315b, then in the forming of the contact hole 319 and finally in the forming of the pixel electrode 321.

However, the photolithography techniques require expensive photo masks and complicated processes such as exposing and developing processes. Thus, excessive processing costs result. Also, it is difficult to manage the production yield of the LCD devices.

SUMMARY OF THE INVENTION

Accordingly, the present invention is directed to a master mold, a master mold fabrication method, and a method for fabricating a liquid crystal display device using the same that substantially obviates one or more of the problems due to limitations and disadvantages of the related art.

An advantage of the present invention is to provide a fabrication method of a thin film transistor array substrate and/or a color filter substrate for a liquid crystal display device without using a photolithography technique.

Another advantage of the present invention is to provide a method using soft lithography, instead of a photolithography technique.

Another advantage of the present invention is to provide a decreased defect rate in using a master mold and a soft mold employed in the soft lithography.

Additional features and advantages of the invention will be set forth in the description which follows, and in part will be apparent from the description, or may be learned by practice of the invention. These and other advantages of the invention will be realized and attained by the structure and method particularly pointed out in the written description and claims hereof as well as the appended drawings.

To achieve these and other advantages and in accordance with the purpose of the present invention, as embodied and broadly described, a master mold includes: a main body; a predetermined pattern formed on the main body; and a hydrophobic group on a surface of the main body.

In another aspect of the present invention, a method for fabricating a master mold includes: stacking a material layer to form a predetermined pattern on a main body; patterning the material layer into the predetermined pattern; and applying a hydrophobic group onto surfaces of the main body and the patterned material layer.

In another aspect of the present invention, a method for fabricating a liquid crystal display device includes: forming a thin film transistor array substrate; forming a color filter substrate; bonding the thin film transistor array substrate and the color filter substrate; and applying a liquid crystal between the thin film transistor array substrate and the color filter substrate, wherein at least one of the forming the thin film transistor array substrate and the forming the color filter substrate includes a pattern forming method using a soft mold.

In another aspect of the present invention, a soft lithography process includes: forming a buffer layer by depositing a liquid resin on a substrate on which a material is stacked; contacting a soft mold having a particular pattern with a surface of the buffer layer; applying a constant heat to the soft mold and buffer layer to transfer the particular pattern onto the buffer layer; and etching the material stacked on the substrate by using the particular pattern as a mask to form a pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, example of which are illustrated in the accompanying drawings.

FIGS. 4A to 4J illustrate an embodiment of a method for fabricating a thin film transistor array substrate of a liquid crystal display (LCD) device using soft lithography according to the present invention. A soft lithography process is a process of forming a pattern using a soft mold.

Figure 4A:
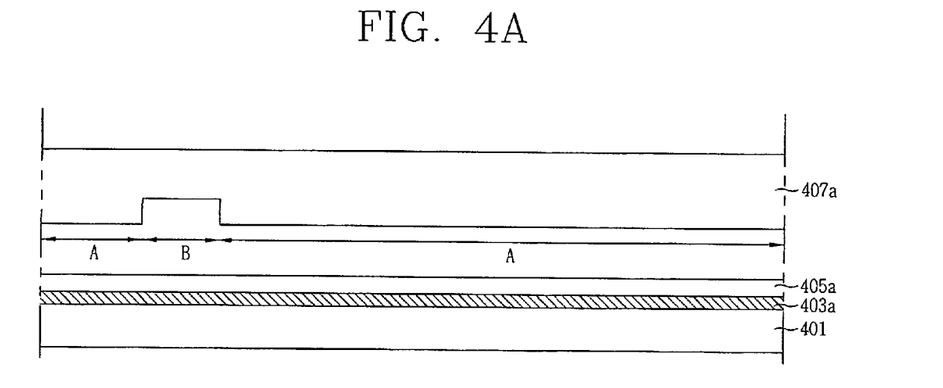
FIGS. 4A, 4B, 4C, 4D, 4E, 4F, 4G, 4H, 4I and 4J are sectional views showing a method for fabricating a thin film transistor array substrate of an LCD device according to the present invention.

As shown in FIG. 4A, a first metal layer 403a is formed on a substrate 401. A buffer layer 405a is formed on the first metal layer 403a. The first metal layer 403a may be formed of an aluminum (Al) or an aluminum alloy, such as AlNd. The buffer layer 405a is formed by depositing a liquid resin, such as polystyrene. The liquid resin has a viscosity that is lowered and a mobility that is increased when heat is applied thereto.

Then, a soft mold 407a with a concave pattern B and a convex pattern A is positioned above the substrate 401 having the first metal layer 403a and the buffer layer 405a. Then, the soft mold 407a is brought into contact with the buffer layer 405a. The soft mold 407a may be formed by hardening a pre-polymer. Accordingly, the soft mold 407a has a soft property. The soft mold 407a may be formed of a material such as polydimethylsiloxane (PDMS), polyurethane or polyimides. Preferably, the soft mold 407a is formed of PDMS mixed with about 10 weight percent of a hardener.

The soft mold 407a is positioned to correspond to a portion where a pattern is to be formed. When the convex pattern A contacts the buffer layer 405a and heat is applied thereto, the viscosity of the buffer layer 405a is instantaneously lowered, and the buffer layer 405a is transferred into the concave pattern B of the soft mold 407a.

Figure 4B:
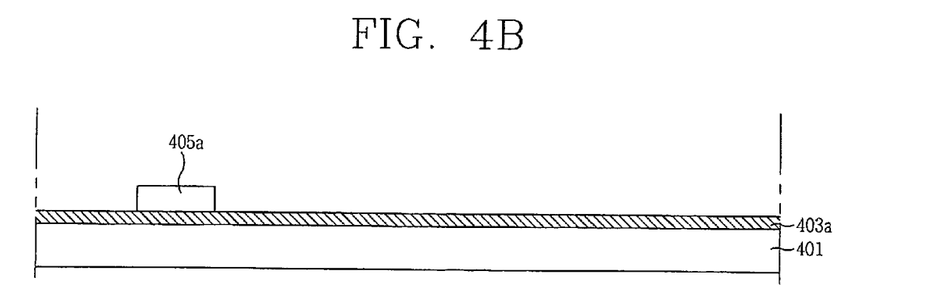

Hence, after a certain time elapses, upon separating the soft mold 407a from the substrate 401, the buffer layer 405a has the same shape as that of the concave pattern B and remains on the first metal layer 403a as shown in FIG. 4B.

Figure 4C:
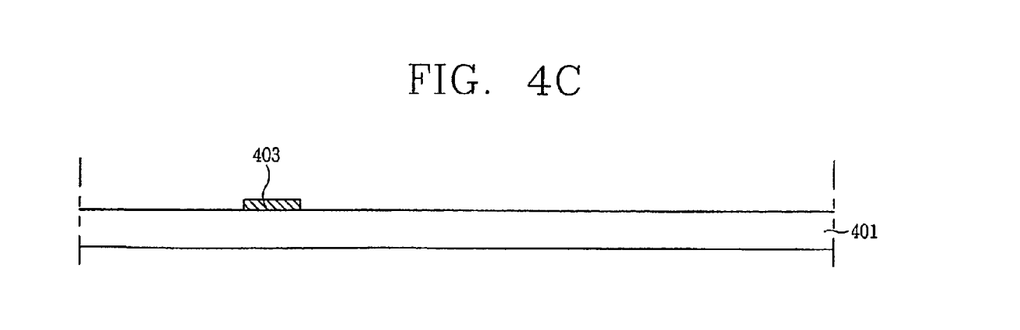

As shown in FIG. 4C, after etching the first metal layer 403a by using the patterned buffer layer 405a as a mask to form a gate electrode 403, the patterned buffer layer 405a is removed.

The soft lithography process may be applied to subsequent patterning processes for the LCD device.

Figure 4D:
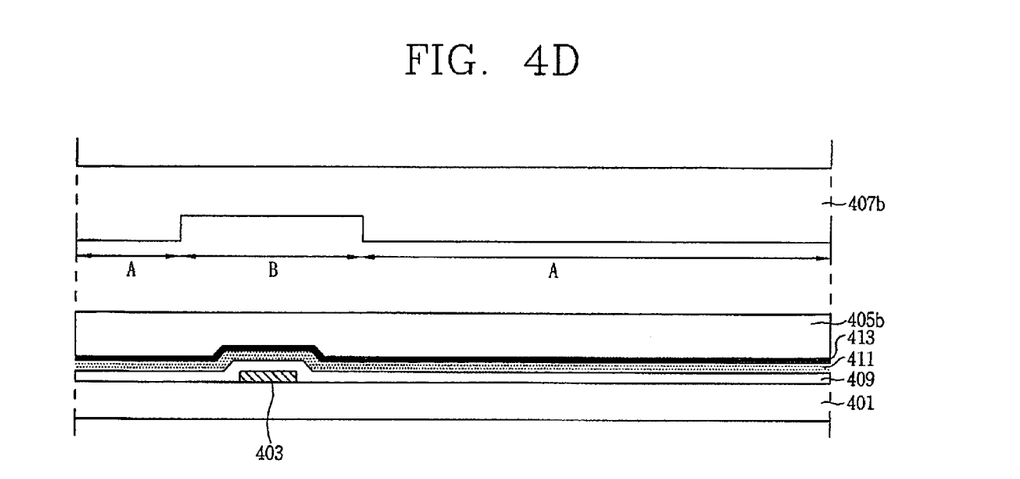

As shown in FIG. 4D, a gate insulating layer 409 and semiconductor layers 411 and 413 are sequentially stacked on the substrate 401 including the gate electrode 403. Then, a buffer layer 405b is formed thereon. The gate insulating layer 409 may be formed of an inorganic insulating material such as a silicon nitride (SiNx) or silicon dioxide ($SiO_2$). The semiconductor layer 411 may be made of a pure amorphous silicon and the semiconductor layer 413 may be made of an amorphous silicon having impurities doped therein.

The buffer layer 405b is stacked on the semiconductor layers 411 and 413, and a soft mold 407b having a particular convex pattern A and concave pattern B is positioned above the buffer layer 405b.

Figure 4E:
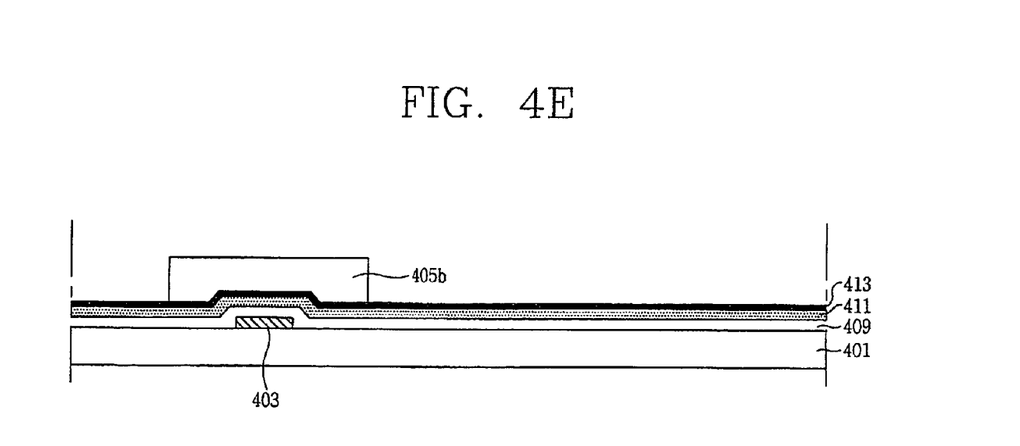

As shown in FIG. 4E, soft lithography is used to form a pattern on the buffer layer 405b.

Figure 4F:
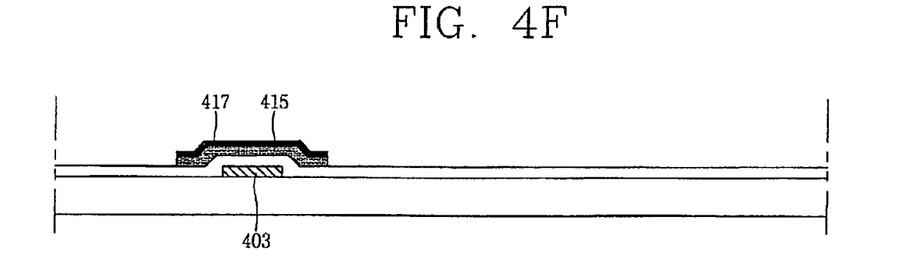

The patterned buffer layer 405b is used as a mask to pattern the semiconductor layers 411 and 413 as shown in FIG. 4F. The semiconductor layer 411, which may be made of pure amorphous silicon, is patterned into an activation layer 415 and the semiconductor layer 413, which may be made of amorphous silicon having impurities doped therein, is patterned into an ohmic contact layer 417.

Figure 4G:
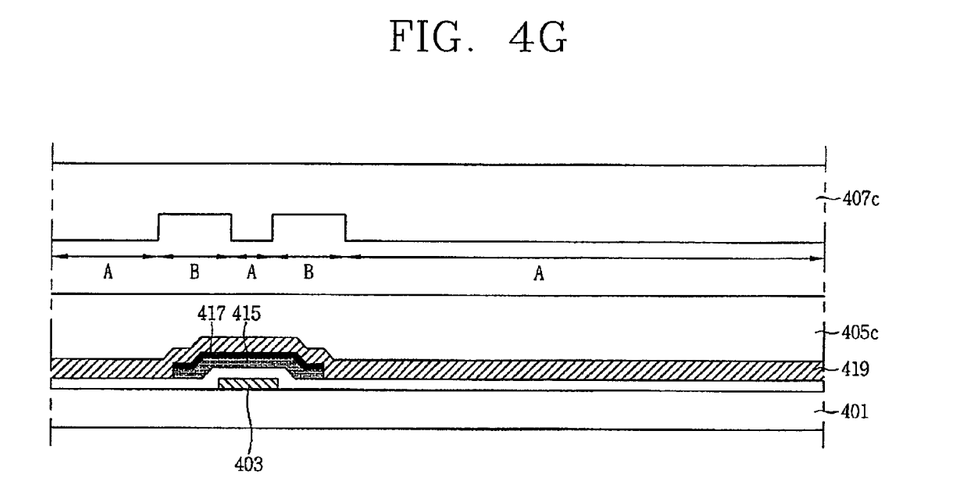

As shown in FIG. 4G, a second metal layer 419, which may be formed of aluminum (Al) or an aluminum alloy, such as AlNd, is formed on an entire surface of the substrate 401 on which the activation layer 415 and the ohmic contact layer 417 have been formed. A buffer layer 405c is stacked on the second metal layer 419. A soft mold 407c having a particular convex pattern A and concave pattern B is positioned above the buffer layer 405c.

Figure 4H:
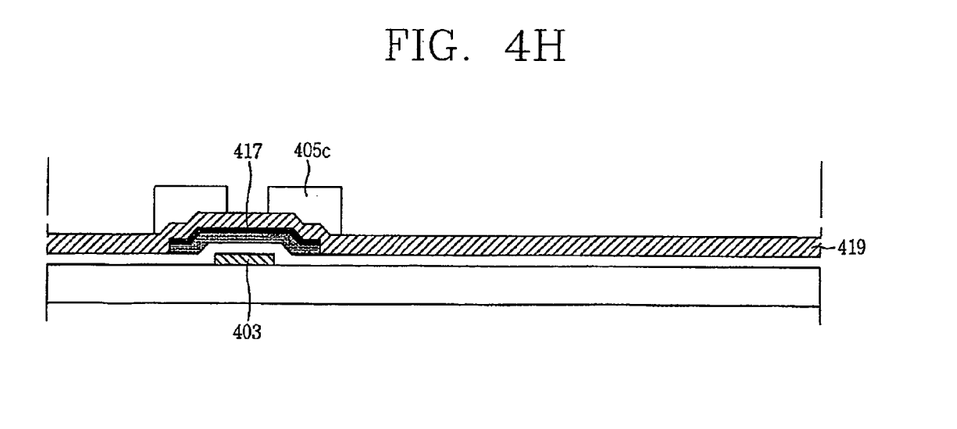
Figure 4I:
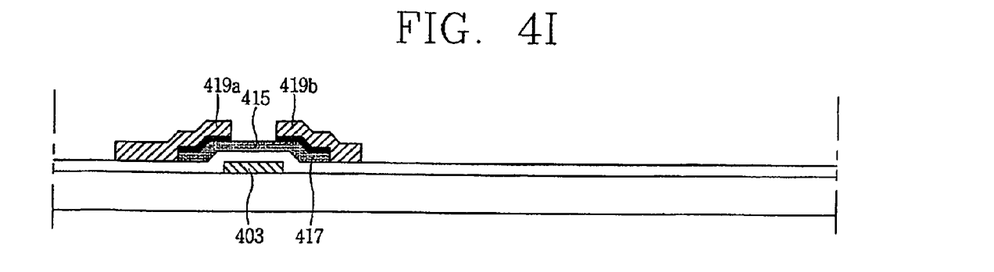

Then, soft lithography is performed to form a pattern in the buffer layer 405c as shown in FIG. 4H. The patterned buffer layer 405c is used as a mask to etch the second metal layer 419 to thereby form source and drain electrodes 419a and 419b as shown in FIG. 4I.

Through the aforementioned processes, a thin film transistor constituting the gate electrode 403, the activation layer pattern 415 and the source and drain electrodes 419a and 419b may be formed.

Figure 4J:
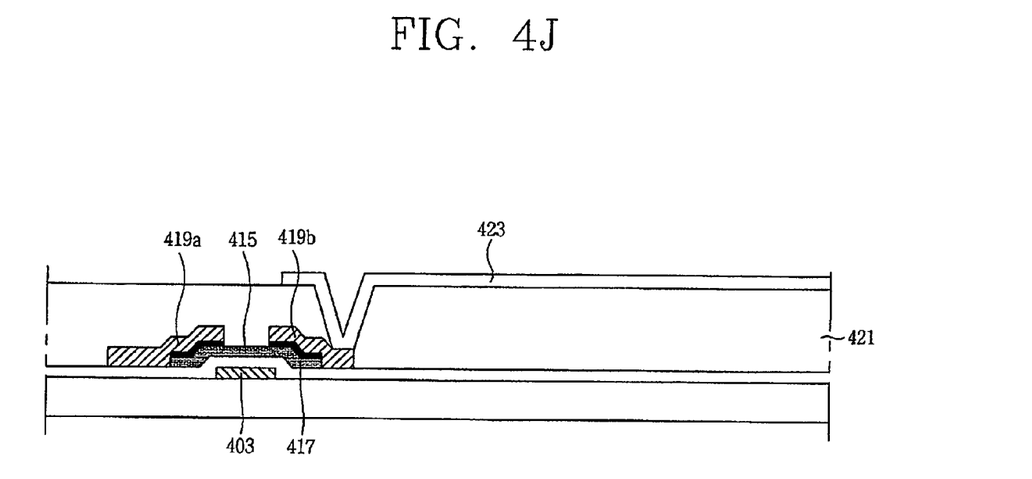

As shown in FIG. 4J, an intermediate layer 421 and a pixel electrode 423 are formed. The intermediate layer 421 may be formed by stacking an organic insulating material, such as benzocyclobutene (BCB) or an acryl based resin. The pixel electrode 423 may be formed by soft lithography.

Thus, a method for fabricating a thin film transistor array substrate for an LCD device using soft lithography is performed. In the embodiment, soft lithography is used to form the gate electrode 403, the activation layer 415, the ohmic contact layer 417, the source/drain electrodes 419a and 419b and the pixel electrode 423. The present invention including soft lithography may also be used in forming various types of patterns and may also be used together with a method such as photolithography.

A master mold required to form the soft mold for the soft lithography may include a main body and a predetermined pattern formed on the main body. The predetermined pattern is made of a material. A hydrophobic group is applied onto surfaces of the main body and the material.

The hydrophobic group may be fluoride. The main body may be a glass substrate or be formed by stacking a metal layer on the glass substrate. The predetermined pattern may be formed of one of a material of metal, silicon dioxide, silicon nitride, photo-resist, and wax.

FIGS. 5A through 5D are sectional views showing a method for fabricating a master mold and a soft mold based on the construction of the master mold according to the present invention.

Figure 5A:
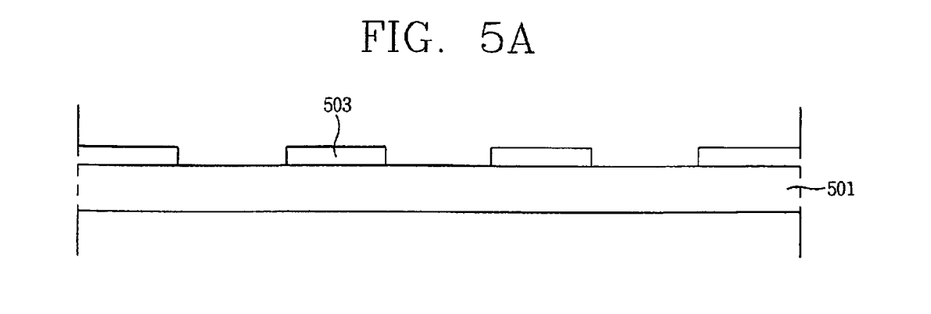
FIGS. 5A, 5B, 5C and 5D are sectional views showing a method for fabricating a master mold and a soft mold according to the present invention.

A material layer for forming a predetermined pattern 503 is stacked on a main body 501. As shown in FIG. 5A, the material layer for forming the predetermined pattern 503 is then patterned. The main body 501 may be a glass substrate or may be formed by stacking a metal layer on the glass substrate. The predetermined pattern 503 may be formed of one of a material of metal, silicon dioxide ($SiO_2$), silicon nitride (SiNx), photo-resist, and wax. Photolithography may be used for patterning the material layer into the predetermined pattern 503.

Figure 5B:
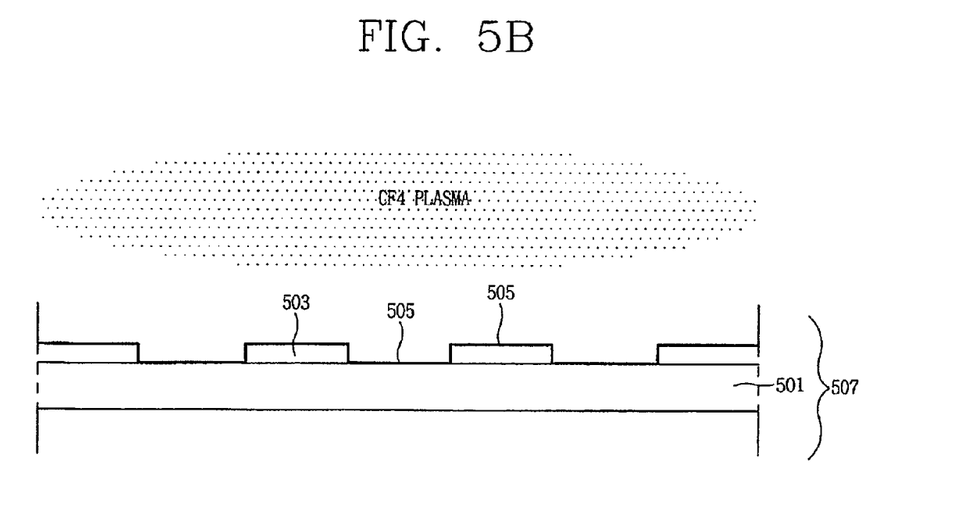

As shown in FIG. 5B, a hydrophobic group 505 is applied onto surfaces of the main body 501 and the predetermined pattern 503. The hydrophobic group 505 may be fluoride. A plasma processing may be performed to apply the hydrophobic group 505 onto the surfaces of the main body 501 and the predetermined pattern 503. A molecule containing a fluorine element (e.g., a gas containing a molecule such as $CF_4$ or $SF_6$) may be used for the plasma processing. The plasma processing may have the following conditions to form the master mold 507: plasma power=700 W; processing pressure=200 Torr; flow amount of $CF_4$=100 sccm; and processing duration=30 seconds.

Figure 5C:
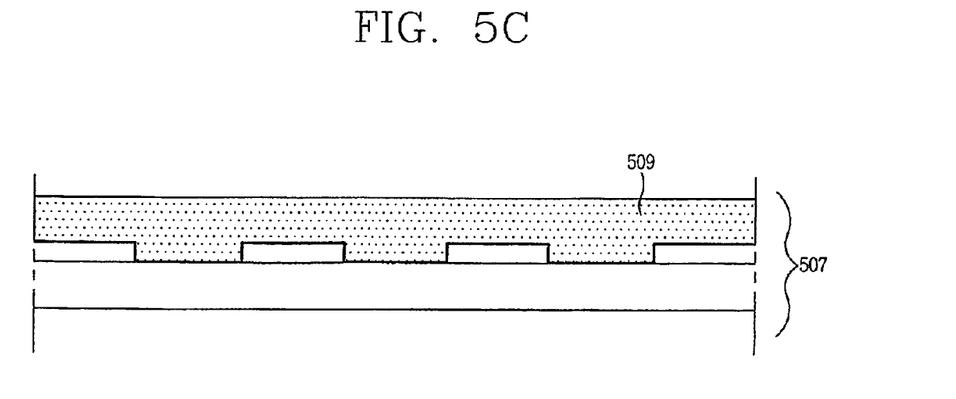

As shown in FIG. 5C, a pre-polymer 509 is deposited on the master mold 507. The pre-polymer 509 is then hardened. A polydimethylsiloxane may be used as the pre-polymer 509. Polyurethane, polyimides or the like may also be used as the pre-polymer 509. The hardened pre-polymer 509 forms the soft mold 511.

Figure 5D:
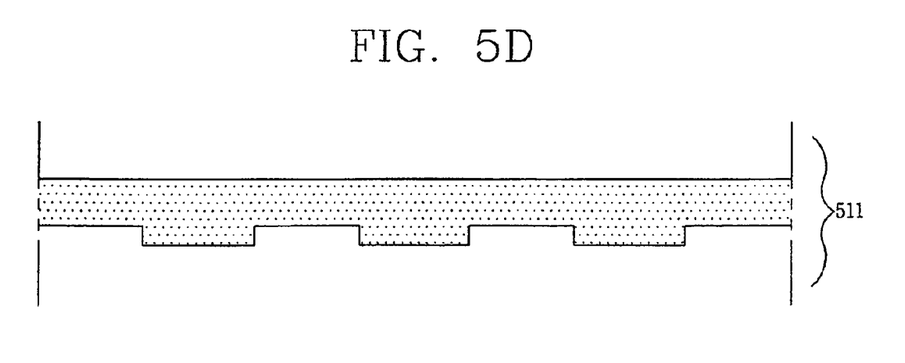

FIG. 5D shows a process for separating the soft mold 511 from the master mold 507. The pattern formed on the master mold 507 is transferred to the surface of the soft mold 511.

The hydrophobic group is applied onto the surfaces of the main body and the predetermined pattern to form the master mold. The hydrophobic group is applied because, in separating the master mold and the soft mold, an adhesive force between the master mold and the soft mold may be problematic. That is, during the separation of the master mold and the soft mold, if an adhesive force between the master mold and the soft mold prevents at least partial separation, the soft mold may have a defective pattern.

The adhesive force between the master mold and the soft mold depends on the hydrophilicity therebetween. A great hydrophilicity between two materials increases the adhesive force therebetween, whereas a low hydrophilicity between two materials decreases the adhesive force therebetween. Hence, as shown in the present invention, when a hydrophobic group, such as the fluoride, is applied onto the surface of the master mold, the adhesive force between the master mold and the soft mold is weakened. Thus, separation between the master mold and the soft mold is easily performed and a defect rate of the pattern in the soft mold is decreased.

The hydrophilicity of the master mold can be determined by performing a test for measuring a contact angle which indicates wetness with water.

In order to measure wetness, a plasma process was performed for a master mold. The master mold included a main body formed by stacking chromium (Cr) on a glass substrate and a photo-resist having a predetermined pattern on the chromium. The contact angle of the photo-resist layer was measured before and after the plasma processing. The plasma processing had the following conditions: plasma power=700 W; processing pressure=200 Torr; flow amount of $CF_4$=100 sccm; and processing duration=30 seconds.

Regarding the measurement result, the contact angle was about 95° on the photo-resist layer before performing the plasma processing. The contact angle was about 110° after the plasma processing. Accordingly, the fluoride group was applied onto the surface of the master mold after the plasma processing to thereby increase hydrophobicity.

As described above, the method for fabricating the LCD device according to the present invention uses soft lithography, which may substitute for photolithography, to decrease processing costs and increase production yield.

In addition, the master mold according to the present invention has a hydrophobic group, such as flouride, applied to the surface thereof, to decrease a defect rate in patterns of the soft mold during the soft mold fabrication.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a master mold comprising:
    stacking a material layer for a predetermined pattern on a main body, wherein the material layer for the predetermined pattern, is formed of one of metal, silicon dioxide ($SiO_2$), silicon nitride (SiNx), photoresist, and wax;
    patterning the material layer by a photolithography process to form a pattern on the main body;
    applying a hydrophobic group onto surfaces of the main body and the pattern by a plasma process to form a master mold, wherein the master mold comprises the main body, the pattern on the main body and the hydrophobic group on the surfaces of the main body and the pattern, and wherein the plasma process is performed using a gas containing a fluorine element, and wherein the hydrophobic group is applied onto the surface of the master mold by the plasma process so that an adhesive force between the master mold and a soft mold is weakened to easily perform the separation therebetween;
    depositing and hardening a pre-polymer on a surface of the master mold which the plasma process is treated, wherein the pre-polymer is formed of one of polydimethylsiloxane (PDMS), polyurethane, and polyimide; and
    separating the pre-polymer from the master mold to form the soft mold, wherein the pattern is transferred onto the surface of the soft mold.

2. The method of claim 1, wherein the hydrophobic group is fluoride.

3. The method of claim 1, wherein the main body is a glass substrate.

4. The method of claim 3, wherein the main body is formed by stacking a metal layer on the glass substrate.

5. The method of claim 1, wherein the gas containing the fluorine element is $CF_4$ or $SF_6$.

6. A method for fabricating a master mold comprising:
    stacking a material layer for a predetermined pattern on a main body, wherein the material layer for the predetermined pattern, is formed of one of metal, silicon dioxide ($SiO_2$), silicon nitride (SiNx), photoresist, and wax;
    patterning the material layer by a photolithography process to form a pattern on the main body;
    applying a hydrophobic group onto surfaces of the main body and the pattern by a plasma process to form a master mold, wherein the master mold comprises the main body, the pattern on the main body and the hydrophobic group on the surfaces of the main body and the pattern, and wherein the plasma process is performed using a gas containing a fluorine element, and wherein the hydrophobic group is applied onto the surface of the master mold by the plasma process so that an adhesive force between the master mold and a soft mold is weakened to easily perform the separation therebetween, and wherein the plasma process is applied by conditions comprising plasma power of 700 W, processing pressure of 200 Torr, flow amount of $CF_4$ of 100 sccm and processing duration of 30 seconds;
    depositing and hardening a pre-polymer on a surface of the master mold which the plasma process is treated, wherein the pre-polymer is formed of one of polydimethylsiloxane (PDMS), polyurethane, and polyimides; and
    separating the pre-polymer from the master mold to form the soft mold, wherein the pattern is transferred onto the surface of the soft mold.

* * * * *